United States Patent
Zhang et al.

(10) Patent No.: US 11,128,314 B2
(45) Date of Patent: Sep. 21, 2021

(54) ERROR CHARACTERISTIC ESTIMATION FOR NAND FLASH

(71) Applicant: SK hynix Inc., Icheon-si (KR)

(72) Inventors: Fan Zhang, San Jose, CA (US);
Chenrong Xiong, San Jose, CA (US);
Meysam Asadi, San Jose, CA (US);
Xuanxuan Lu, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/450,724

(22) Filed: Jun. 24, 2019

(65) Prior Publication Data

US 2020/0403634 A1    Dec. 24, 2020

(51) Int. Cl.
*H03M 13/11*    (2006.01)
*G06F 11/10*    (2006.01)
*G11C 29/52*    (2006.01)

(52) U.S. Cl.
CPC ..... *H03M 13/1108* (2013.01); *G06F 11/1072* (2013.01); *H03M 13/116* (2013.01); *H03M 13/1111* (2013.01); *G11C 29/52* (2013.01)

(58) Field of Classification Search
CPC .............. G11C 29/52; H03M 13/1108; H03M 13/1111; G06F 11/1072
See application file for complete search history.

(56) References Cited

U.S. PATENT DOCUMENTS

| | | | |
|---|---|---|---|
| 7,409,622 B1* | 8/2008 | Lu | H03M 5/145 375/262 |
| 8,839,073 B2* | 9/2014 | Cohen | G06F 3/0658 714/763 |
| 8,990,665 B1 | 3/2015 | Steiner et al. | |
| 9,092,353 B1 | 7/2015 | Micheloni et al. | |
| 9,417,797 B2* | 8/2016 | Chen | G11C 16/28 |
| 9,542,258 B1* | 1/2017 | Lu | G06F 11/1072 |
| 10,481,974 B2* | 11/2019 | Kwok | G11C 16/3418 |
| 2010/0332949 A1* | 12/2010 | d'Abreu | G06F 11/1004 714/766 |
| 2012/0290899 A1 | 11/2012 | Cideciyan et al. | |
| 2014/0068365 A1* | 3/2014 | Chen | G06F 11/106 714/746 |
| 2014/0365847 A1 | 12/2014 | Weingarten | |
| 2015/0194983 A1 | 7/2015 | Varanasi et al. | |

(Continued)

*Primary Examiner* — Steve N Nguyen
(74) *Attorney, Agent, or Firm* — Weaver Austin Villeneuve & Sampson LLP

(57) ABSTRACT

Techniques related to improving a performance related to at least data reads from a memory are described. In an example, data is stored in a block of the memory as codewords. A data read includes a determination of whether each bit from a portion of the block is a zero or a one based on voltage measurements. Prior to decoding the codewords by performing a decoding procedure by an ECC decoder of the memory, a first number of errors "$E_{01}$" and a second number of errors "$E_{10}$" are estimated, where the first number of errors "$E_{01}$" is associated with bits each being a true zero and erroneously determined as a one, and where the second number of errors "$E_{10}$" associated with bits each being a true one and erroneously determined as a zero. Thereafter, the decoding of the codewords based on the decoding procedure is performed.

17 Claims, 7 Drawing Sheets

(56) References Cited

U.S. PATENT DOCUMENTS

| | | |
|---|---|---|
| 2015/0200688 A1* | 7/2015 | Pan .................... G06F 11/1012 |
| | | 714/794 |
| 2015/0303948 A1 | 10/2015 | Yoon et al. |
| 2016/0210190 A1 | 7/2016 | Ha et al. |
| 2016/0301427 A1 | 10/2016 | Sprouse et al. |
| 2017/0024279 A1* | 1/2017 | Lu ....................... G06F 11/1068 |
| 2017/0255403 A1 | 9/2017 | Sharon et al. |
| 2017/0272102 A1* | 9/2017 | Goldenberg ........ G06F 11/1012 |
| 2019/0044541 A1 | 2/2019 | Kwok |

* cited by examiner

SLC 310

L0  1

L1  0

MLC 320

L0  11

L1  10

L2  01

L3  00

TLC 330

L0  111

L1  110

L2  101

L3  100

L4  011

L5  010

L6  001

L7  000

QLC 340

ERROR CHARACTERISTIC ESTIMATION FOR NAND FLASH

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND

Data integrity is an important feature for any data storage device and data transmission. Error-correction codes (ECCs) are typically used for various types of data storage devices include NAND flash memory devices. ECCs are also frequently used during the process of data transmission.

Generally, ECC refers to codes that add redundant data, or parity data, to a message, such that the message can be recovered by a receiver even when a number of errors were introduced, either during the process of transmission, or storage. The ECC can correct the errors up to the capability of the code being used. Low-density parity-check code (LDPC) is an example of ECC.

In a data storage device, such as a NAND flash memory device, data can be written to and read from blocks of the data storage device. Failures in a block can occur. An ECC decoder can be used to handle these failures if the resulting errors are within the error correction capability of the decoder.

BRIEF SUMMARY

Techniques related to improving a performance related to at least data reads are described. In an example, a computer system includes a memory storing bits of a codeword and an error correction code (ECC) decoder decoding the codeword. The computer system is configured to perform a number of operations. The operations include determining, based on voltage measurements, whether each bit stored in a portion of a block of the memory is a zero or a one. The operations also include, prior to decoding the codeword by performing a decoding procedure by the ECC decoder, estimating a first number of errors "$E_{01}$" associated with bits each being a true zero and erroneously determined as a one and a second number of errors "$E_{10}$" associated with bits each being a true one and erroneously determined as a zero. The operations also include performing the decoding of the codeword based on the decoding procedure after the first number of errors "$E_{01}$" and the second number of errors "$E_{10}$" are estimated.

In an example, the portion of the block is a page of the block.

In an example, the decoding of the first number of errors "$E_{01}$" and the second number of errors "$E_{10}$" are input to the decoding procedure.

In an example, the operations also include receiving a data write command to at least the portion of the block and updating a data write procedure to the portion of the block based on the first number of errors "$E_{01}$" and the second number of errors "$E_{10}$".

In an example, determining whether each bit is a zero or a one is based on a hard decoding procedure that uses the voltage measurements.

In an example, estimating the first number of errors "$E_{01}$" and the second number of errors "$E_{10}$" includes computing a checksum of the bits that are determined based on the voltage measurements.

In an example, estimating the first number of errors "$E_{01}$" and the second number of errors "$E_{10}$" includes determining a first count of the bits that are determined as a one based on the voltage measurements and a second count of the bits that are determined as a zero based on the voltage measurements.

In an example, estimating the first number of errors "$E_{01}$" and the second number of errors "$E_{10}$" includes determining a flip bit count as a function of a checksum of the bits that are determined based on the voltage measurements.

In an example, estimating the first number of errors "$E_{01}$" includes determining a first count of the bits that are determined as a one based on the voltage measurements, determining a second count of the bits that are determined as a zero based on the voltage measurements, and determining a flip bit count as a function of a checksum of the bits that are determined based on the voltage measurements. The first number of errors "$E_{01}$" is based on the first count, the second count, and the flip bit count.

In an example, determining whether each bit is a zero or a one is based on a hard decoding procedure that uses the voltage measurements. Estimating the first number of errors "$E_{01}$" and the second number of errors "$E_{10}$" includes computing a checksum of the bits that are determined based on the voltage measurements, determining a first count "$C_1$" of the bits that are determined as a one based on the voltage measurements, determining a second count "$C_0$" of the bits that are determined as a zero based on the voltage measurements, determining a flip bit count "E" as a function of the checksum. The first number of errors "$E_{01}$" is based on the first count, the second count, and the flip bit count. For instance, the function is a linear function, the first number of errors "$E_{01}$" is estimated as $(C_1-C_0+E)/2$, and the second number of errors "$E_{10}$" is estimated as $(E-C_1+C_0)/2$.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures.

FIG. 3 illustrates an example of bit storage in NAND flash memories, in accordance with certain embodiments of the present disclosure.

DETAILED DESCRIPTION

Figure 1:
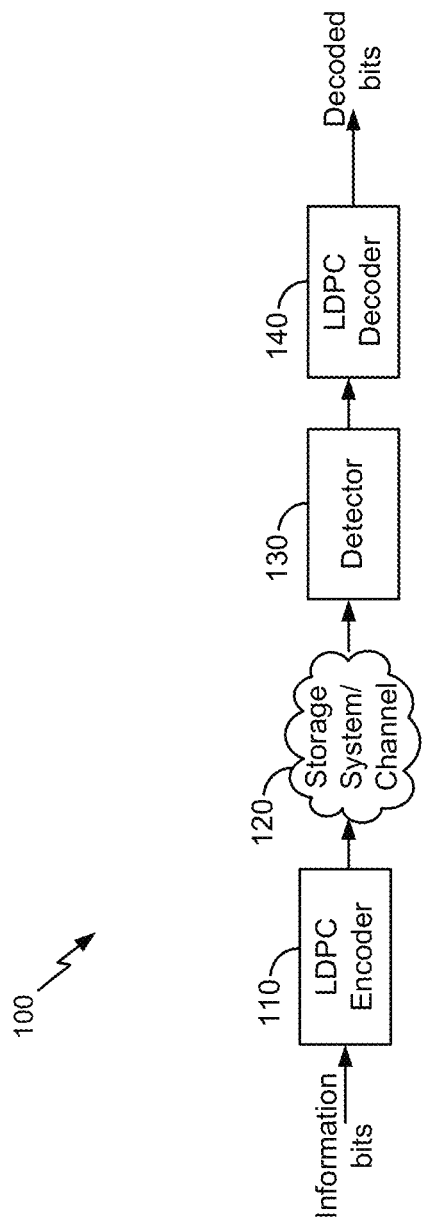
FIG. 1 illustrates an example of a high level block diagram of an error correcting system, in accordance with certain embodiments of the present disclosure.

Techniques related to improving a performance related to at least data reads from a memory are described. The memory can include NAND flash. The probability of errors related to reading a bit as a one when the bit is truly a zero and the probability of errors related to reading a bit as a zero when the bit is truly a one can be asymmetric when the memory is approaching its end of life (EOL). Knowing the probabilities of 0-to-1 and 1-to-0 can improve the decoding performance significantly. A "0-to-1" represents a zero bit going to a one, resulting in this bit being read as a one when it is truly a zero. Conversely, a "1-to-0" represents a one bit going to a zero, resulting in this bit being read as a zero when it is truly a one. Various reasons exist for these errors including electrical and physical failures in the memory as it approaches its EOL. Further, the ratio of errors of going from 0-to-1 and 1-to-0 is asymmetric and can vary with condition (e.g., program/erase cycles, retention, etc.) and physical location of the data (e.g., die, block, wordline, page, etc.). Because of all these difficulties, using a pre-computed table to record asymmetric ratio is unrealistic for a practical implementation.

Instead, embodiments of the present disclosure involve estimating the asymmetric ratio as a part of decoding codewords stored in the memory. One challenge is that the decoding may not be improved if the asymmetric ratio is not known. However, the asymmetric ratio may not be known until the decoding is performed. As a solution to this challenge, the asymmetric ratio can be estimated as an initial step before an ECC decoding procedure is performed by an ECC decoder of the memory. For instance, a hard decoding is performed in the initial step to estimate the asymmetric ratio. Thereafter, an ECC decoding procedure is used. As such, once estimated, the asymmetric ratio can be used as input to the ECC decoding procedure, thereby improving the decoding performance. Additionally or alternatively, the asymmetric ratio can be used as a parameter in a next data write command to the memory.

In an example, data is stored in a block of a memory, where the data is protected with an ECC code, such as by being stored as LDPC codewords or some other type of codewords depending on the ECC encoding procedure. Upon a data read command, a determination is made whether each bit from a portion of the block (e.g., from a page of the block) is a zero or a one based on voltage measurements. This determination can represent a hard decoding that compares the voltage measurements to one or more voltage thresholds. Prior to decoding the codewords by performing a decoding procedure by an ECC decoder of the memory (e.g., an LDPC decoding procedure when the codewords are LDPC codewords), a first number of errors "$E_{01}$" and a second number of errors "$E_{10}$" are estimated, where the first number of errors "$E_{01}$" is associated with bits each being a true zero and erroneously determined as a one, and where the second number of errors "$E_{10}$" associated with bits each being a true one and erroneously determined as a zero. For instance, the first number of errors "$E_{01}$" represents the count of errors of going from 0-to-1, and the second number of errors "$E_{10}$" represents the count of errors of going from 1-to-0. The ratio of these two numbers can correspond to the asymmetric ratio described herein above. After the first number of errors "$E_{01}$" and the second number of errors "$E_{10}$" are estimated, the decoding of the codewords based on the decoding procedure is performed.

The embodiments of the present disclosure provide several advantages related to computer storage. For example, the first and second numbers of errors "$E_{01}$" and "$E_{10}$" (or, similarly, their ratio) can be used in the decoding procedure, thereby improving the decoding performance including the bit error rate performance. In addition, the first and second numbers of errors "$E_{01}$" and "$E_{10}$" (or, similarly, their ratio) can be used in the next encoding procedure, thereby improving the bit error rate when the next decoding procedure is performed. In this way, failures in the memory can be handled such that the performance of the memory is substantially retained until at least its actual EOL.

In the interest of clarity of explanation, the embodiments of the present disclosure are described in connection with LDPC codewords and NAND flash memory devices. However, the embodiments are not limited as such and apply to any other encoding decoding procedures and any other type of storage.

FIG. 1 illustrates an example of a high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic, solid state) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes. The connections between variable nodes and check nodes are described by and correspond to the values of the parity-check matrix.

In an example, a hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. This step can be referred as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes, also include reliability of each bit.

In another example, a soft message passing algorithm may be performed. In this example, $L(q_{ij})$ represents a message that is sent by variable node $v_i$ to check node $c_j$; $L(r_{ji})$ represents the message sent by check node $c_j$ to variable node $v_i$; and $L(c_i)$ represents initial LLR value for each variable node $v_i$. Variable node processing for each $L(q_{ij})$ can be done through the following steps:

(1) Read $L(c_i)$ and $L(r_{ji})$ from memory.
(2) Calculate $L(Q_i\text{-sum}) = L(c_i) + \text{Scaling Factor} * \Sigma_{j \in c_i} L(r_{ij})$.
(3) Calculate each $L(Q_i\text{-sum}) - L(r_{ij})$.
(4) Output $L(Q_i\text{-sum})$ and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each $L(r_{ji})$ can be performed as follows:
(1) Read one row of qij from memory.
(2) Calculate L(Rj-sum) as follows:

$$L(Rj\text{-sum}) = \left(\prod_{i' \in R_j} \alpha_{i'j}\right) \phi\left(\sum_{i' \in R_j} \phi(\beta_{i'j})\right)$$

$$\alpha_{ij} = \text{sign}(L(q_{ij})), \beta_{ij} = |L(q_{ij})|,$$

$$\phi(x) = -\log\left(\tanh\left(\frac{x}{2}\right)\right) = \log\left(\frac{e^x + 1}{e^x - 1}\right)$$

(3) Calculate the individual $L(r_{ji}) = (\prod_{i' \in R_{j\backslash i}} \alpha_{i'j}) \emptyset (\Sigma_{i' \in R_{j\backslash i}} \emptyset (\beta_{i'j}))$ for check nodes.
(4) Write back $L(r_{ji})$ to memory.
(5) If this is not the last row of memory, then go to the first step and increment j by one.

Figure 2:
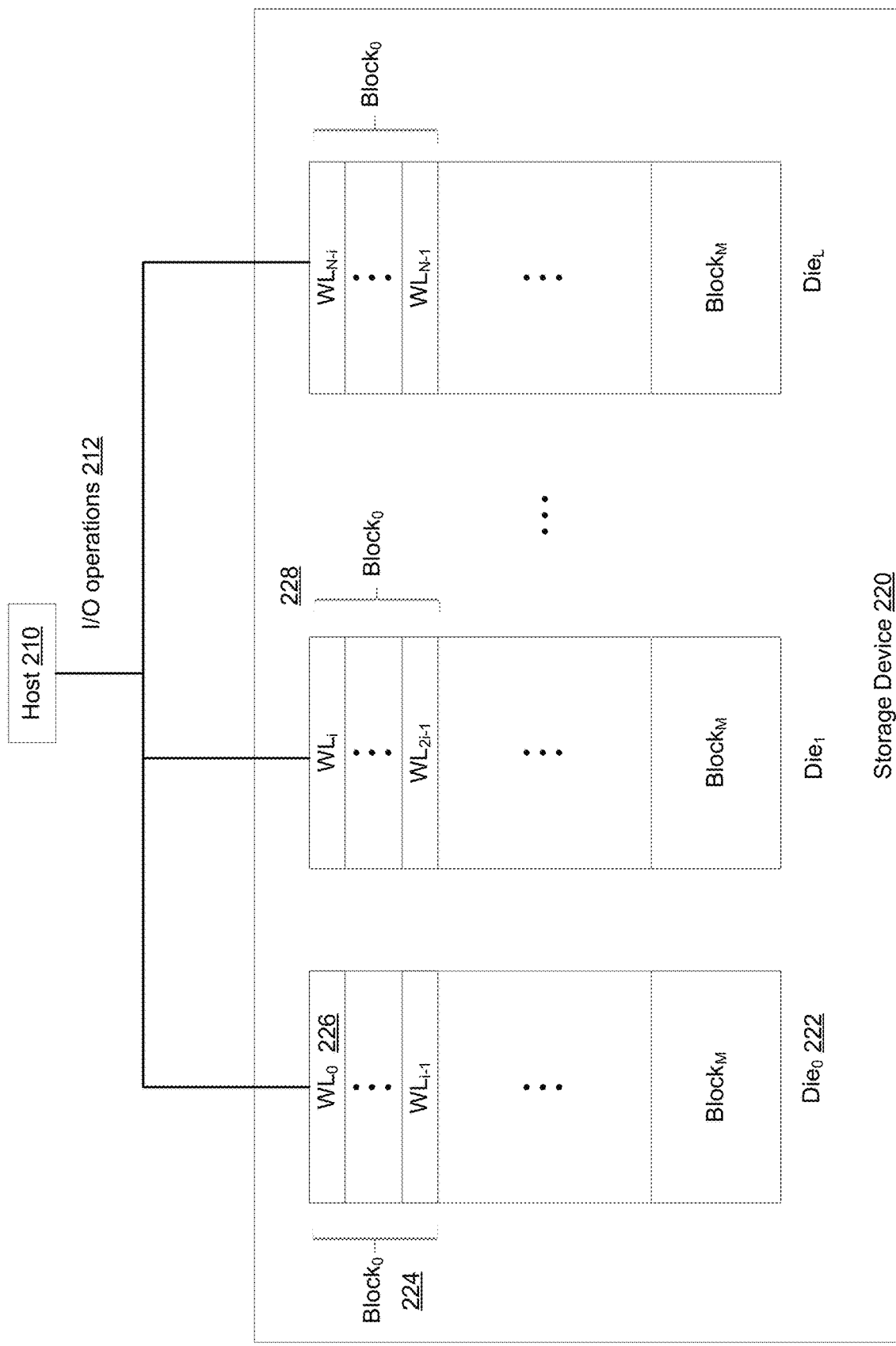
FIG. 2 illustrates an example of a computer system that includes a host and a storage device, in accordance with certain embodiments of the present disclosure.

FIG. 2 illustrates an example of a computer system that includes a host 210 and a storage device 220, in accordance with certain embodiments of the present disclosure. The host 210 performs I/O operations 212 including writing data to the storage device 220 and reading data from the storage device 220. In an example, writing the data includes encoding the data with one or more LDPC encoders (not shown in FIG. 2) to generate LDPC codewords that are stored in the storage device 220. Reading the data includes decoding the LDPC codewords with one or more LDPC decoders (not shown in FIG. 2) to output decoded data from the storage device 220. The encoding and decoding (e.g., the LDPC encoder(s) and decoder(s)) are part of an ECC system that can be implemented between the host 210 and the storage device 220.

In an example, the storage device 220 includes a number of memory dies 222 (this number is shown as "L" in FIG. 2). In turn, each memory die 222 contains memory cells that can be organized in a number of blocks 224 (this number is shown as "M" in FIG. 2). Each of the blocks 224 contains a number of wordlines 226 (this number is shown as "i" in FIG. 2). The memory cells may be floating-gate transistors such as floating-gate MOSFETs. The memory cells may be grouped and/or referenced using a wide range of configurations, including columns, bitlines, pages, and wordlines. Other groupings of memory cells 102 are also possible, including groupings across different chips, dies, planes, among others. In some embodiments, a page of a block can represent a minimum programmable unit and a minimum readable unit.

For NAND flash, each block 224 contains sixty-four pages for a single-level cell (SLC) flash, one-hundred twenty-eight pages for a multi-level cell (MLC) flash, three-hundred eighty-four pages triple-level cell (TLC) flash. The size of a page can range from 2 KB to 8 KB. In MLC flash, the two bits within a single cell are not mapped to the same page. Rather, the collection of most significant bits (MSBs) from a group of cells form a page called the MSB page. The least significant bits (LSBs) from the same group of cells form a page called the LSB page. Similarly, for TLC, MSB and LSB pages exist. In addition, bits that are from the same group and that are between the MSBs and LSBs form a page called the central significant bit (CSB) page.

In some instances, one or more components of the storage device 220 may become unusable due to failure prior to or during operation of storage device 220. Causes of a failure may be due to defects during the manufacturing process, mechanical stress to the storage device 220 prior to or during use, degradation of the dielectric material in memory cells, among others. Failures may occur at the memory cell level, which may propagate and cause failures within other components of the storage device 220. A group of memory cells can be considered to fail when no data from any one of the memory cells in the group is writable and/or readable. Additionally or alternatively, a group may be considered to fail when at least one of the memory cells in the group is neither writable and/or readable. In such instances, an EEC scheme (e.g., a combination of an ECC encoding procedure and an ECC decoding procedure) is usable to protect and/or recover the data in the failed group.

FIG. 3 illustrates an example of bit storage in NAND flash memories, in accordance with certain embodiments of the present disclosure. Four such memories are illustrated: a single-level cell (SLC) NAND flash memory 310, a multiple-level cell (MLC) NAND flash memory 320, a triple-level cell (TLC) NAND flash memory 330, and a quad-level cell (QLC) NAND flash memory 340. Generally, one or more bits are stored in a cell depending on the type of the NAND flash memory. The storage relies on a mapping that associates a value of a bit (e.g., whether a "0" or a "1") with a voltage level. A voltage level corresponds to a range of voltage such that, if a voltage read falls in the range, this voltage can be declared as belonging to the voltage level.

Specific to the SLC NAND flash memory 310, one bit (e.g., an information bit or a parity bit) can be stored in a cell. Hence, there are two possible voltage levels for the cell. The mapping defines a voltage threshold between these two levels. To check whether the cell contains a "0" or a "1," voltage is read and compared to the voltage threshold to identify the relevant voltage level and, accordingly, the value of the bit. For instance, if the read voltage value is smaller than the voltage threshold, the first voltage level is identified and the bit is determined to be a "0." Otherwise, the second voltage level is identified and the bit is determined to be a "1." A 0-to-1 error can occur when the voltage measurement indicates that the bit should be read as a "1," when in fact the voltage value should have been smaller than the voltage threshold. A 1-to-0 error can occur when the voltage measurement indicates that the bit should be read as a "0," when in fact the voltage value should have been larger than the voltage threshold.

In comparison, for the MLC NAND flash memory 320, two bits can be stored in a cell. Hence, there are four possible voltage levels for the cell. The mapping defines three voltage thresholds between these four levels. To check whether each bit contained in the cell is a "0" or a "1," voltage is read and compared to the three voltage thresholds to identify the relevant voltage level and, accordingly, the bit values. Here also, 0-to-1 and 1-to-0 errors can occur depending on the voltage measurements.

Similarly, for the TLC NAND flash memory 330 and QLC NAND flash memory 340, three bits and four bits, respectively, can be stored in a cell. Hence, there are eight and sixteen possible voltage levels for the cell for the TLC NAND flash memory 330 and QLC NAND flash memory 340, respectively. The mapping of TLC NAND flash memory 330 defines seven voltage thresholds between the eight voltage levels. The mapping of QLC NAND flash memory 340 defines fifteen voltage thresholds between the sixteen voltage levels. To check whether each bit contained in the cell is a "0" or a "1," voltage is read and compared to the voltage thresholds to identify the relevant voltage level and, accordingly, the bit values. Here also, 0-to-1 and 1-to-0 errors can occur depending on the voltage measurements.

Figure 4:
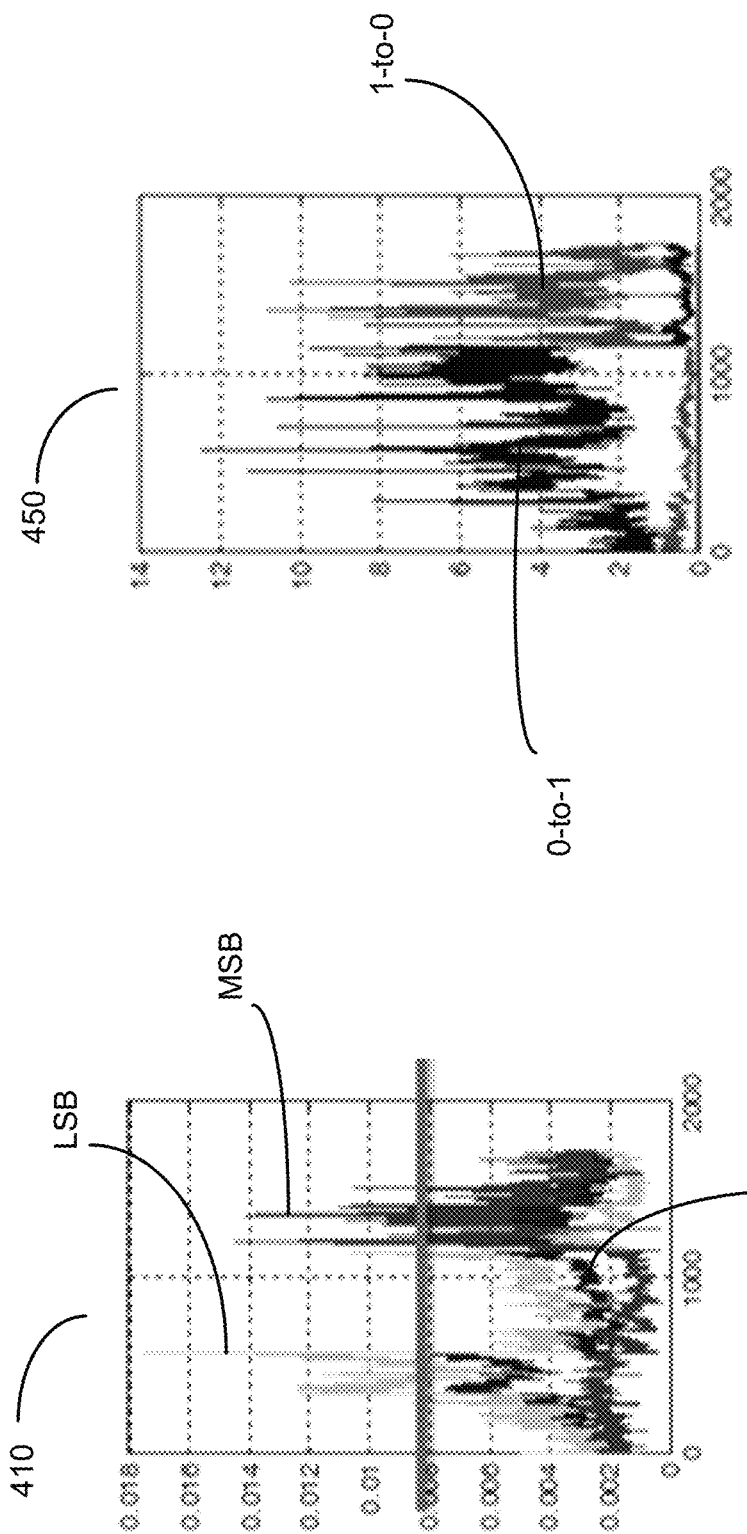
FIG. 4 illustrates an example of measurements showing an asymmetric error ratio in NAND flash memories, in accordance with certain embodiments of the present disclosure.

FIG. 4 illustrates an example of measurements showing an asymmetric error ratio in NAND flash memories, in accordance with certain embodiments of the present disclosure. On the left side of FIG. 4, measurements 410 are illustrated showing the indexes of pages within a block on the horizontal axis and the corresponding raw bit error rate (RBER) on the vertical axis. A horizontal line at about RBER of 0.8 is shown and corresponds to the error correction capability of an ECC decoder. Three RBER measurements are shown, one for MSB pages, one for LSB pages, and one for CSB pages as labeled in the measurements 410. On the right side of FIG. 4, measurements 450 are illustrated showing the indexes of pages within the block on the horizontal axis and the corresponding error ratios on the vertical axis. Two error ratio curves are shown, one for the 0-to-1 errors and one for the 1-to-0 errors, as labeled in the measurements 450. These error ratio curves are generates from the measurements 410. If the error ratios symmetric, the error ratio curves would substantially be horizontal lines at the ratio of one. However, and as shown in the measurements 450, the error ratios are highly asymmetric. The reasons for the asymmetric error ratios can be glanced from the measurements 410, including the different RBER performances of the MSB, LSB, and CSB pages. By accounting for the asymmetric error ratios in the data reads and/or data writes, the RBER performances of the MSB, LSB, and CSB pages can be improved.

Figure 5:
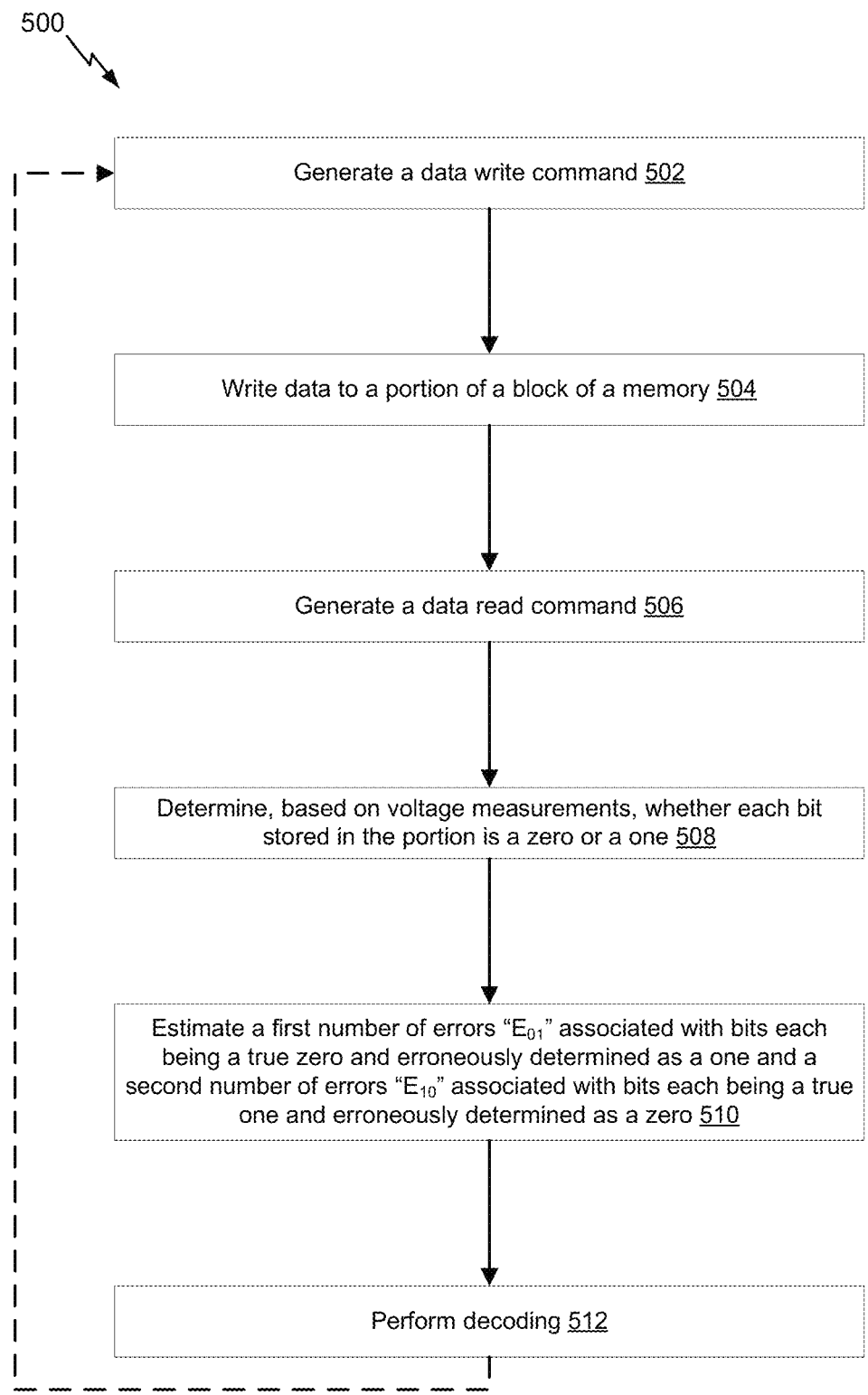
FIG. 5 illustrates an example of a flow for decoding codewords from a block of a memory, in accordance with certain embodiments of the present disclosure.
Figure 6:
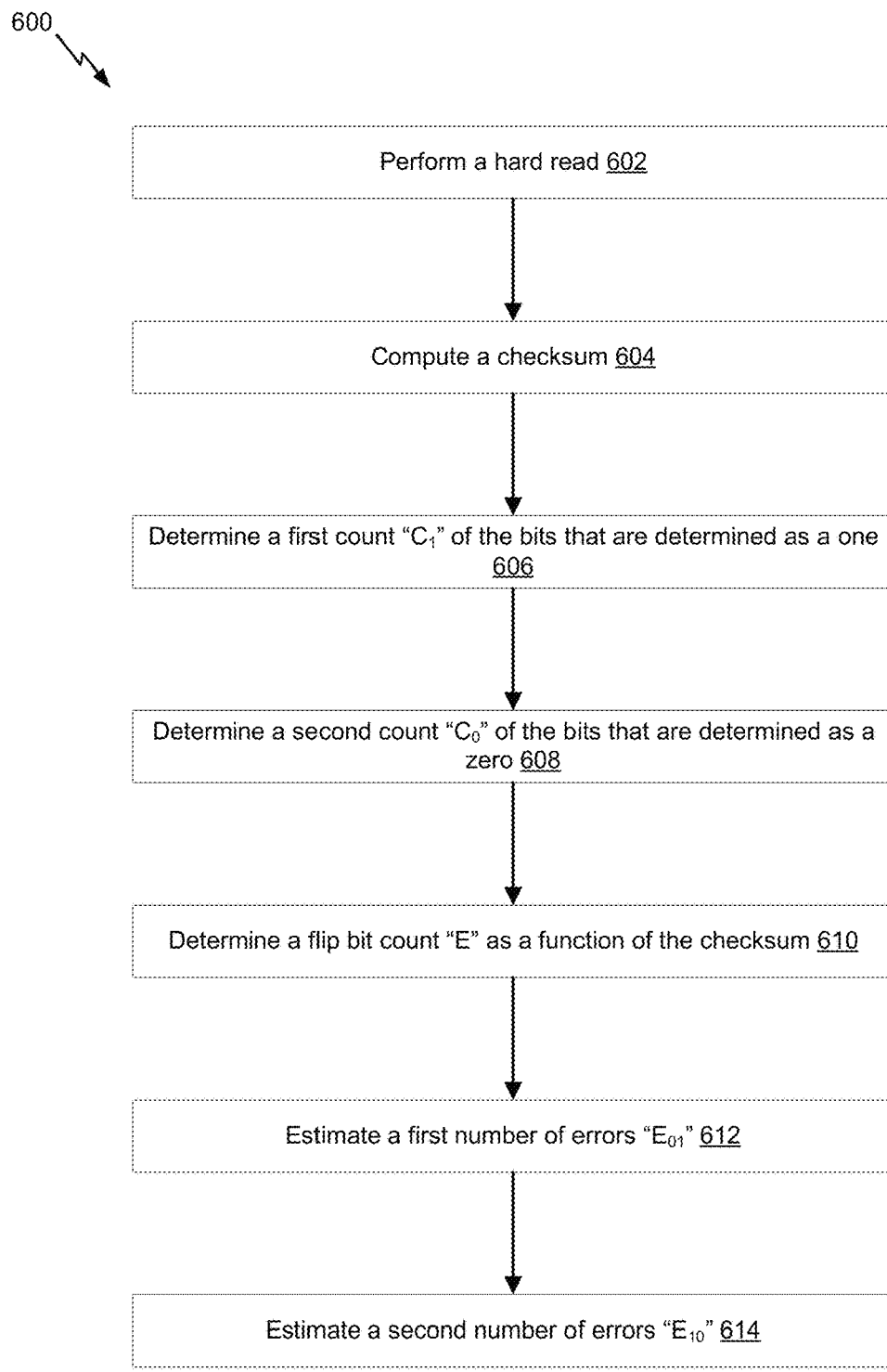
FIG. 6 illustrates an example of a flow for estimating a number of errors prior to decoding codewords from a block of a memory, in accordance with certain embodiments of the present disclosure.

FIGS. 5-6 illustrate example flows for improving a performance related to at least data reads. A computer system is described as performing particular operations of the example flows. The computer system is an example of the error correction system 100 of FIG. 1 and of the host 210 and the storage device 220 of FIG. 2. The computer system have a specific hardware configuration to perform the operations. Alternatively or additionally, the computer system may include generic hardware configured with specific instructions. In an example, the computer system includes one or more processors and one or more memories. The memory(ies) stores computer-readable instructions to embody functionalities specific to the computer system. The instructions, when executed by the processor(s), result in performance of the functionalities. The instructions stored in the memory(ies) in conjunction with the underlying processor(s) represent means for performing the functionalities. Some of the operations across the example flows are similar. In the interest of brevity, the similarities are not repeated herein. Further, although the operations are illustrated in a particular order, other arrangement of the operations are possible and some of the operations may be skipped as it would be apparent to a person skilled in the art.

FIG. 5 illustrates an example of a flow 500 for decoding codewords from a block of a memory, in accordance with certain embodiments of the present disclosure. The flow 500 may start at operation 502, where the computer system generates a data write command. For example, the computer system includes a host and a memory, such as a NAND flash memory (or some other type of storage device). The host may store data in the memory for a client. Doing so includes receiving a request from the client to store the data. In response, the host generates and sends the data write command to the memory. This command can identify a portion of the memory (e.g., a page within a block of the NAND flash memory) to store the data and can include the data (e.g., information bits).

At operation 504, the computer system writes the data to the portion of the block of the memory. In an example, writing the data can include protecting the information bits with an ECC encoding procedures, such as one that uses parity bits, to store the data as codewords. The codewords can be written to the portion of the block based on a set of write parameters including programming write speed, voltage ranges, and/or voltage thresholds among other parameters.

At operation 506, the computer system generates a data read command. For example, the host may receive a request for the data from the client. In response, the host generates and sends the data read command to the memory. This command may identify the portion of the block from which the data of the client should be read.

At operation 508, the computer system determines, based on voltage measurements, whether each bit stored in the portion of the block of the memory is a zero or a one. In an example, this operation corresponds to a hard read of the bits by, for instance an ECC decoder of the memory, that uses one or more read parameters, such as read programming speed, voltage ranges, and voltage thresholds. For instance, in SLC flash where a memory cell stores a single bit, the voltage measured in associated with that cell is compared to a voltage threshold. If smaller than the threshold, the bit is determined be a zero. Otherwise, the bit is determined to be a one. In memory cells storing more than one bit (e.g., MLC, TLC, or QLC flash), the voltage is compared to voltage ranges or multiple voltage threshold to determine whether each bit stored in the memory cell is a zero or a one.

At operation 510, the computer system estimates a first number of errors "$E_{01}$" associated with bits each being a true zero and erroneously determined as a one and a second number of errors "$E_{10}$" associated with bits each being a true one and erroneously determined as a zero. In an example, an ECC decoder of the memory estimates these two number at the end of the hard decoding based on a checksum of the determined bits and prior to performing a decoding procedure.

At operation 512, the computer system performs the decoding of the codewords based on the decoding procedure after the first number of errors "$E_{01}$" and the second number of errors "$E_{10}$" are estimated. In an example, the decoding procedure is an ECC decoding procedure that may be a soft decoding procedure or a hard decoding procedure. The two numbers "$E_{01}$" and "$E_{10}$" can be input to the decoding procedure, such that the decoding of the codewords accounts for these two numbers "$E_{01}$" and "$E_{10}$." For instance, these two numbers can be converted to soft information for use in the soft decoding procedure. In another illustration, the two numbers "$E_{01}$" and "$E_{10}$" can be used to adjust the read parameters, such as the voltage thresholds, and the already performed voltage measurements can be re-evaluated according to the adjusted read parameters (e.g., the voltage measurements of the MSB page can be compared again to the adjusted voltage thresholds) as an initial step before the start of the soft decoding procedure. Further, and as illustrated with the dotted line looping back to operation 502, the write parameters associated with the portion of the block of the memory can be updated based on the two numbers "$E_{01}$" and "$E_{10}$." For instance, the write programming speed can be made relatively slower to previous writes to the MSB page, and/or or the voltage ranges and/or thresholds can be increased or decreased as applicable.

FIG. 6 illustrates an example of a flow 600 for estimating a number of errors prior to decoding codewords from a block of a memory, in accordance with certain embodiments of the present disclosure. Some of the operations of the flow 600 can be implemented as sub-operations of operation 508-510 of flow 500 of FIG. 5.

The flow 600 of FIG. 6 may start at operation 602, where the computer system performs a hard read of bits. In an example, the hard read is performed for a page of a block and results in "d" bits, each determined to be a zero or a one.

At operation 604, the computer system computes a checksum of the bits. In an example, computing the checksum depends on the encoding procedure. For instance, and for LDPC encoding that uses a parity check matrix "H," the checksum "S" is computed as S=d×H.

At operation 606, the computer system determines a first count "$C_1$" of the bits that are determined as a one based on the voltage measurements (e.g., the one bits). For example, the computer system maintains a first counter and this counter is incremented by a value of one each time a one bit is determined.

At operation 608, the computer system determines a second count "$C_0$" of the bits that are determined as a zero based on the voltage measurements (e.g., the zero bits). For example, the computer system maintains a second counter and this counter is incremented by a value of one each time a zero bit is determined. In another example, the second count "$C_0$" is computer as $C_0 = N - C_1$, where "N" represents the number of bits in the page.

At operation 610, the computer system determines a flip bit count "E" as a function of the checksum (e.g., E=ƒ(S), where "ƒ" is a function). In an example, the function "ƒ" is a linear function that depends on the encoding procedure (e.g., depends on the parity check matrix "H" of the LDPC encoding procedure). For instance, E=2.3×S+373.5.

At operation 612, the computer system estimates the first number of errors "$E_{01}$" based on the first count, the second count, and the flip bit count. In an example, the first number of errors "$E_{01}$" is determined as $E_{01} = (C_1 - C_0 + E)/2$.

At operation 614, the computer system the computer system estimates the second number of errors "$E_{10}$" based on the first count, the second count, and the flip bit count. In an example, the second number of errors "$E_{10}$" is determined as $E_{10} = (E - C_1 + C_0)/2$.

In addition to determining the two numbers "$E_{01}$" and "$E_{10}$," the computer system can determine a ratio of the errors. For instance, the ratio is equal to $E_{10}/E_{01}$.

Figure 7:
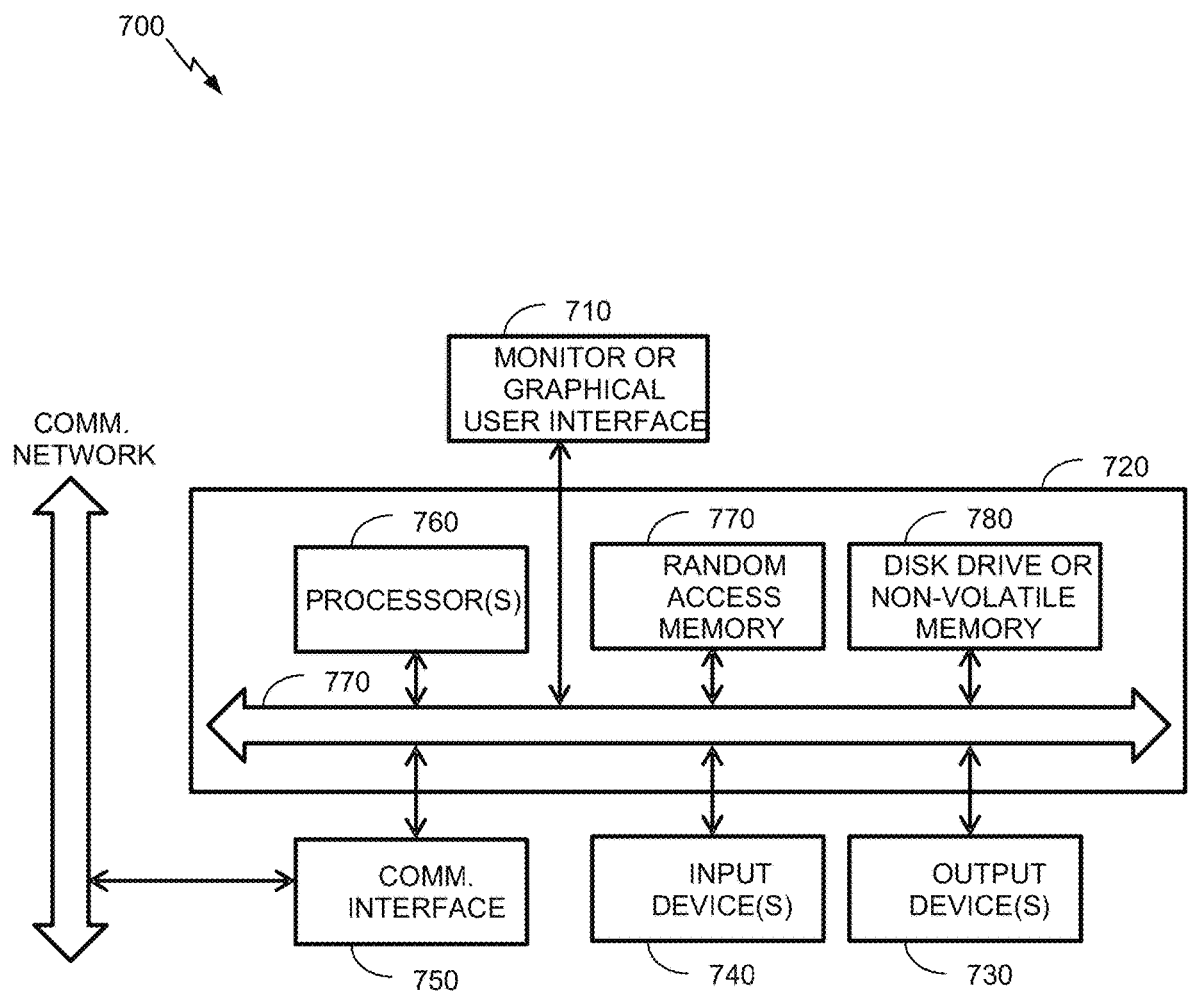
FIG. 7 is representative of a computer system capable of embodying the present disclosure.

FIG. 7 is representative of a computer system capable of embodying the present disclosure, such as the error correction system 100 of FIG. 1. FIG. 7 is merely illustrative of an embodiment of the present disclosure and does not limit the scope of the disclosure as recited in the claims. In one embodiment, the system is a computer system 700 that typically includes a monitor 710, a computer 720, user output devices 730, user input devices 740, communications interface 750, and the like. The error correction system 100 of FIG. 1 implements some or all of the components of the computer system 700.

As shown in FIG. 7, the computer 720 may include a processor(s) 760 that communicates with a number of peripheral devices via a bus subsystem 790. These peripheral devices may include the user output devices 730, the user input devices 740, the communications interface 750, and a storage subsystem, such as random access memory (RAM) 770 and disk drive 780.

The user input devices 740 include all possible types of devices and mechanisms for inputting information to the computer system 720. These may include a keyboard, a keypad, a touch screen incorporated into the display, audio input devices such as voice recognition systems, microphones, and other types of input devices. In various embodiments, the user input devices 740 are typically embodied as a computer mouse, a trackball, a track pad, a joystick, a wireless remote, a drawing tablet, a voice command system, an eye tracking system, and the like. The user input devices 740 typically allow a user to select objects, icons, text and the like that appear on the monitor 710 via a command such as a click of a button or the like.

The user output devices 730 include all possible types of devices and mechanisms for outputting information from the computer 720. These may include a display (e.g., the monitor 710), non-visual displays such as audio output devices, etc.

The communications interface 750 provides an interface to other communication networks and devices. The communications interface 750 may serve as an interface for receiving data from and transmitting data to other systems. Embodiments of the communications interface 750 typically include an Ethernet card, a modem (telephone, satellite, cable, ISDN), (asynchronous) digital subscriber line (DSL) unit, FireWire interface, USB interface, and the like. For example, the communications interface 750 may be coupled to a computer network, to a FireWire bus, or the like. In other embodiments, the communications interfaces 750 may be physically integrated on the motherboard of the computer 720, and may be a software program, such as soft DSL, or the like.

In various embodiments, the computer system 700 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 720 includes one or more Xeon microprocessors from Intel as the processor(s) 760. Further, one embodiment, the computer 720 includes a UNIX-based operating system.

The RAM 770 and the disk drive 780 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 770 and the disk drive 780 may be configured to store the basic programming and data constructs that provide the functionality of the present disclosure.

Software code modules and instructions that provide the functionality of the present disclosure may be stored in the RAM 770 and the disk drive 780. These software modules may be executed by the processor(s) 760. The RAM 770 and the disk drive 780 may also provide a repository for storing data used in accordance with the present disclosure.

The RAM 770 and the disk drive 780 may include a number of memories including a main random access memory (RAM) for storage of instructions and data during program execution and a read-only memory (ROM) in which fixed non-transitory instructions are stored. The RAM 770 and the disk drive 780 may include a file storage subsystem providing persistent (non-volatile) storage for program and data files. The RAM 770 and the disk drive 780 may also include removable storage systems, such as removable flash memory.

The bus subsystem 790 provides a mechanism for letting the various components and subsystems of the computer 720 communicate with each other as intended. Although the bus subsystem 790 is shown schematically as a single bus, alternative embodiments of the bus subsystem may utilize multiple busses.

FIG. 7 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method implemented on a computer system that includes a memory storing bits of a codeword and an error correction code (ECC) decoder decoding the codeword, the method comprising:
   determining, based on voltage measurements of a hard decoding procedure, whether each bit stored in a portion of a block of the memory is a zero or a one;
   prior to decoding the codeword by performing a soft decoding procedure by the ECC decoder, estimating a first number of errors "$E_{01}$" associated with bits each being a true zero and erroneously determined as a one and a second number of errors "$E_{10}$" associated with bits each being a true one and erroneously determined as a zero, the first number of errors "$E_{01}$" and the second number of errors "$E_{10}$" determined based on the voltage measurements of the hard decoding procedure, wherein estimating the first number of errors "$E_{01}$" comprises:
      determining a first count "$C_1$" of the bits that are determined as a one based on the voltage measurements;
      determining a second count "$C_0$" of the bits that are determined as a zero based on the voltage measurements; and
      determining a flip bit count "E" as a function of a checksum of the bits that are determined based on the voltage measurement, the first number of errors "$E_{01}$" being based on the first count, the second count, and the flip bit count; and
   performing the decoding of the codeword by the soft decoding procedure after the first number of errors "$E_{01}$" and the second number of errors "$E_{10}$" are estimated, the soft decoding procedure performed based on the first number of errors "$E_{01}$" and the second number of errors "$E_{10}$".

2. The method of claim 1, wherein the portion of the block is a page of the block.

3. The method of claim 2, wherein the decoding of the first number of errors "$E_{01}$" and the second number of errors "$E_{10}$" are input to the soft decoding procedure.

4. The method of claim 1, further comprising:
   receiving a data write command to at least the portion of the block; and
   updating a data write procedure to the portion of the block based on the first number of errors "$E_{01}$" and the second number of errors "$E_{10}$".

5. The method of claim 1, wherein determining whether each bit is a zero or a one is based on the hard decoding procedure that uses the voltage measurements.

6. The method of claim 1, wherein estimating the first number of errors "$E_{01}$" and the second number of errors "$E_{10}$" comprises computing the checksum of the bits that are determined based on the voltage measurements.

7. The method of claim 1, wherein estimating the first number of errors "$E_{01}$" and the second number of errors "$E_{10}$" comprises determining the first count of the bits that are determined as a one based on the voltage measurements and the second count of the bits that are determined as a zero based on the voltage measurements.

8. The method of claim 1, wherein estimating the first number of errors "$E_{01}$" and the second number of errors "$E_{10}$" comprises determining the flip bit count.

9. The method of claim 1, wherein determining whether each bit is a zero or a one is based on the hard decoding procedure that uses the voltage measurements, and wherein estimating the first number of errors "$E_{01}$" and the second number of errors "$E_{10}$" comprises:
- computing the checksum of the bits that are determined based on the voltage measurements;
- determining the first count "$C_1$" of the bits that are determined as a one based on the voltage measurements;
- determining the second count "$C_0$" of the bits that are determined as a zero based on the voltage measurements; and
- determining the flip bit count "E" as the function of the checksum, wherein the first number of errors "$E_{01}$" is based on the first count, the second count, and the flip bit count.

10. The method of claim 9, wherein the function is a linear function.

11. The method of claim 10, wherein the second number of errors "$E_{10}$" is estimated as $(E-C_1+C_0)/2$.

12. The method of claim 9, wherein the first number of errors "$E_{01}$" is estimated as $(C_1-C_0+E)/2$.

13. A computer system comprising:
- a memory storing bits of a codeword; and
- an error correction code (ECC) decoder communicatively coupled with the memory and configured to:
  - determine, based on voltage measurements of a hard decoding procedure, whether each bit stored in a portion of a block of the memory is a zero or a one;
  - prior to decoding the codeword by performing a soft decoding procedure, estimate a first number of errors "$E_{01}$" associated with bits each being a true zero and erroneously determined as a one and a second number of errors "$E_{10}$" associated with bits each being a true one and erroneously determined as a zero, the first number of errors "$E_{01}$" and the second number of errors "$E_{10}$" determined based on the voltage measurements of the hard decoding wherein to estimate the first number of errors "$E_{01}$" and the second number of errors "$E_{10}$" comprises to:
    - compute a checksum of the bits that are determined based on the voltage measurements;
    - determine a first count "$C_1$" of the bits that are determined as a one based on the voltage measurements;
    - determine a second count "$C_0$" that are determined as a zero based on the voltage measurements; and
    - determine a flip bit count "E" as a function of the checksum, wherein the first number of errors "$E_{01}$" is based on the first count, the second count, and the flip bit count; and
  - perform the decoding of the codeword by the decoding procedure after the first number of errors "$E_{01}$" and the second number of errors "$E_{10}$" are estimated, the soft decoding procedure performed based on the first number of errors "$E_{01}$" and the second number of errors "$E_{10}$".

14. The computer system of claim 13, wherein the first number of errors "$E_{01}$" is estimated as $(C_1-C_0+E)/2$.

15. The computer system of claim 14, wherein the second number of errors "$E_{10}$" is estimated as $(E-C_1+C_0)/2$.

16. A non-transitory computer-readable storage medium storing instructions that, upon execution on a computer system that includes a memory storing bits of a codeword and an error correction code (ECC) decoder decoding the codeword, cause the computer system to perform operations comprising:
- determining, based on voltage measurements of a hard decoding procedure, whether each bit stored in a portion of a block of the memory is a zero or a one;
- prior to decoding the codeword by performing a soft decoding procedure by the ECC decoder, estimating a first number of errors "$E_{01}$" associated with bits each being a true zero and erroneously determined as a one and a second number of errors "$E_{10}$" associated with bits each being a true one and erroneously determined as a zero, the first number of errors "$E_{01}$" and the second number of errors "$E_{10}$" determined based on the voltage measurements of the hard decoding procedure, wherein estimating the first number of errors "$E_{01}$" and the second number of errors "$E_{10}$" comprises:
  - computing a checksum of the bits that are determined based on the voltage measurements;
  - determining a first count "$C_1$" of the bits that are determined as a one based on the voltage measurements;
  - determining a second count "$C_0$" of the bits that are determined as a zero based on the voltage measurements; and
  - determining a flip bit count "E" as a function of the checksum, wherein the first number of errors "$E_{01}$" is based on the first count, the second count, and the flip bit count; and
- performing the decoding of the codeword by the decoding procedure after the first number of errors "$E_{01}$" and the second number of errors "$E_{10}$" are estimated, the soft decoding procedure performed based on the first number of errors "$E_{01}$" and the second number of errors "$E_{10}$".

17. The non-transitory computer-readable storage medium of claim 16, wherein the first number of errors "$E_{01}$" is estimated as $(C_1-C_0+E)/2$, and wherein the second number of errors "$E_{10}$" is estimated as $(E-C_1+C_0)/2$.

* * * * *